(12) United States Patent
Yoo et al.

(10) Patent No.: US 11,866,819 B2
(45) Date of Patent: Jan. 9, 2024

(54) SURFACE TREATMENT APPARATUS AND SURFACE TREATMENT METHOD

(71) Applicant: SEMES CO., LTD., Cheonan-si (KR)

(72) Inventors: Sung Nam Yoo, Hwaseong-si (KR); Sun Il Kim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 17/510,712

(22) Filed: Oct. 26, 2021

(65) Prior Publication Data

US 2022/0136100 A1 May 5, 2022

(30) Foreign Application Priority Data

Oct. 30, 2020 (KR) .................. 10-2020-0143563

(51) Int. Cl.
| | |
|---|---|
| *C23C 14/56* | (2006.01) |
| *C23C 14/58* | (2006.01) |
| *C23C 14/02* | (2006.01) |
| *B05C 5/00* | (2006.01) |
| *B05C 5/02* | (2006.01) |

(52) U.S. Cl.
CPC ............. *C23C 14/56* (2013.01); *B05C 5/00* (2013.01); *B05C 5/02* (2013.01); *C23C 14/021* (2013.01); *C23C 14/5873* (2013.01)

(58) Field of Classification Search
None
See application file for complete search history.

(56) References Cited

U.S. PATENT DOCUMENTS

| | | | | | |
|---|---|---|---|---|---|
| 3,212,914 | A | * | 10/1965 | Lyle ...................... | C23C 4/126 239/81 |
| 3,745,034 | A | * | 7/1973 | Smith et al. ............. | B05B 5/14 427/370 |
| 4,025,664 | A | * | 5/1977 | Gerek ................. | B05B 13/0609 427/195 |
| 4,411,935 | A | * | 10/1983 | Anderson ............... | B05B 7/205 118/308 |
| 5,389,407 | A | * | 2/1995 | Sokol ..................... | C23C 4/137 427/427 |

(Continued)

FOREIGN PATENT DOCUMENTS

| | | |
|---|---|---|
| CN | 101218375 A | 7/2008 |
| CN | 108292598 A | 7/2018 |

(Continued)

OTHER PUBLICATIONS

Chinese Office Action dated Oct. 30, 2023 issued in corresponding Chinese Patent Application No. 202111271116.5.

*Primary Examiner* — Jethro M. Pence
(74) *Attorney, Agent, or Firm* — Harness, Dickey & Pierce, P.L.C.

(57) ABSTRACT

The inventive concept provides a method for treating a surface of an object to be treated, in which a part provided and contaminated in an apparatus for treatment of a substrate such as a wafer serves as the object to be treated. In an embodiment, the surface treatment method includes forming a vacuum in an atmosphere in which the object is provided and cleaning the surface of the object by collision of first particles with contaminants on the surface of the object at supersonic speed.

10 Claims, 7 Drawing Sheets

(56) References Cited

U.S. PATENT DOCUMENTS

| | | | | |
|---|---|---|---|---|
| 5,776,249 A * | 7/1998 | Rutz | ............... | B05B 12/006 |
| | | | | 239/407 |
| 6,280,802 B1 * | 8/2001 | Akedo | ............... | C23C 4/02 |
| | | | | 427/523 |
| 6,915,964 B2 * | 7/2005 | Tapphorn | ............... | B22F 3/001 |
| | | | | 239/128 |
| 7,681,808 B2 * | 3/2010 | Shimada | ............... | B05B 7/0861 |
| | | | | 239/296 |
| 7,908,993 B2 * | 3/2011 | Yasui | ............... | B05D 1/02 |
| | | | | 414/217 |
| 7,954,448 B2 * | 6/2011 | Yasui | ............... | B05B 12/36 |
| | | | | 118/308 |
| 8,636,846 B2 * | 1/2014 | Norimatsu | ............... | B05B 7/1445 |
| | | | | 427/180 |
| 8,701,590 B2 * | 4/2014 | Kay | ............... | B05B 12/008 |
| | | | | 118/308 |
| 8,875,649 B2 * | 11/2014 | Haas | ............... | B05B 14/10 |
| | | | | 118/308 |
| 9,608,174 B2 * | 3/2017 | Matsunaga | ............... | B05C 9/10 |
| 9,611,391 B2 * | 4/2017 | Ajdelsztajn | ............... | C23C 24/04 |
| 9,687,864 B2 * | 6/2017 | Fulton | ............... | B05D 1/04 |
| 10,328,441 B2 * | 6/2019 | Jang | ............... | C23C 24/04 |
| 10,350,616 B2 * | 7/2019 | Hirano | ............... | C23C 24/04 |
| 10,672,632 B2 * | 6/2020 | Kawai | ............... | B01D 53/04 |
| 10,981,159 B2 * | 4/2021 | Park | ............... | B01J 37/04 |
| 11,020,762 B2 * | 6/2021 | Lutz | ............... | B05B 12/14 |
| 2002/0168466 A1 * | 11/2002 | Tapphorn | ............... | B05B 7/226 |
| | | | | 427/454 |
| 2004/0089230 A1 * | 5/2004 | Schwarz | ............... | B05B 13/0221 |
| | | | | 118/308 |
| 2004/0121084 A1 * | 6/2004 | Kitani | ............... | H01L 41/314 |
| | | | | 427/562 |
| 2004/0250757 A1 * | 12/2004 | Natsuyama | ............... | B05B 13/025 |
| | | | | 118/300 |
| 2005/0000419 A1 * | 1/2005 | Keudell | ............... | B05B 14/48 |
| | | | | 118/326 |
| 2005/0084701 A1 * | 4/2005 | Slattery | ............... | B22F 10/66 |
| | | | | 427/372.2 |
| 2005/0098103 A1 * | 5/2005 | Miyoshi | ............... | C23C 24/04 |
| | | | | 118/712 |
| 2005/0126476 A1 * | 6/2005 | Shutic | ............... | B05B 5/1683 |
| | | | | 118/308 |
| 2005/0211162 A1 * | 9/2005 | Osawa | ............... | C23C 24/04 |
| | | | | 427/248.1 |
| 2005/0220994 A1 * | 10/2005 | Mehta | ............... | B05B 15/25 |
| | | | | 427/256 |
| 2006/0040048 A1 * | 2/2006 | Han | ............... | C23C 24/04 |
| | | | | 427/446 |
| 2006/0102074 A1 * | 5/2006 | Hatono | ............... | C23C 24/04 |
| | | | | 118/300 |
| 2006/0124057 A1 * | 6/2006 | Sasaki | ............... | C23C 24/04 |
| | | | | 118/712 |
| 2006/0177573 A1 * | 8/2006 | Pui | ............... | A61L 31/16 |
| | | | | 118/308 |
| 2006/0180078 A1 * | 8/2006 | Iizuka | ............... | C23C 16/4486 |
| | | | | 118/300 |
| 2007/0009756 A1 * | 1/2007 | Miyamoto | ............... | C23C 24/04 |
| | | | | 428/617 |
| 2007/0151663 A1 * | 7/2007 | Steinmann | ............... | E04C 2/26 |
| | | | | 427/180 |
| 2007/0181060 A1 * | 8/2007 | Renn | ............... | B41J 2/415 |
| | | | | 118/300 |
| 2007/0190261 A1 * | 8/2007 | Darnell | ............... | B05B 12/20 |
| | | | | 427/424 |
| 2007/0199824 A1 * | 8/2007 | Hoerr | ............... | C25D 17/007 |
| | | | | 205/80 |
| 2007/0278103 A1 * | 12/2007 | Hoerr | ............... | A61L 27/34 |
| | | | | 205/80 |
| 2008/0264336 A1 * | 10/2008 | Schwarz | ............... | B05B 13/0257 |
| | | | | 427/2.3 |
| 2009/0056620 A1 * | 3/2009 | Oda | ............... | C23C 4/129 |
| | | | | 118/300 |
| 2009/0298251 A1 * | 12/2009 | Choi | ............... | C23C 24/04 |
| | | | | 118/308 |
| 2010/0061876 A1 * | 3/2010 | Miller | ............... | B22F 7/04 |
| | | | | 419/25 |
| 2010/0073883 A1 * | 3/2010 | Miyamato | ............... | C23C 24/04 |
| | | | | 361/709 |
| 2010/0136229 A1 * | 6/2010 | Kawakita | ............... | C23C 24/04 |
| | | | | 427/180 |
| 2010/0304036 A1 * | 12/2010 | Kuroda | ............... | B05B 7/205 |
| | | | | 118/308 |
| 2011/0059258 A1 * | 3/2011 | Fritz | ............... | B05B 14/40 |
| | | | | 118/712 |
| 2011/0104369 A1 | 5/2011 | Kim et al. | | |
| 2011/0189390 A1 * | 8/2011 | Yumoto | ............... | C23C 14/02 |
| | | | | 118/724 |
| 2011/0238161 A1 * | 9/2011 | Fulton | ............... | B05B 5/032 |
| | | | | 428/323 |
| 2011/0250361 A1 | 10/2011 | Vijay | | |
| 2012/0247670 A1 | 10/2012 | Dobashi et al. | | |
| 2013/0043635 A1 * | 2/2013 | Kayamoto | ............... | H01L 21/68792 |
| | | | | 269/309 |
| 2013/0056187 A1 * | 3/2013 | Kayamoto | ............... | H01L 21/67109 |
| | | | | 427/180 |
| 2013/0072075 A1 * | 3/2013 | Kayamoto | ............... | C23C 24/04 |
| | | | | 427/123 |
| 2013/0089749 A1 * | 4/2013 | Slattery | ............... | B22F 3/15 |
| | | | | 419/38 |
| 2013/0112383 A1 * | 5/2013 | Hanamachi | ............... | B23P 15/26 |
| | | | | 165/170 |
| 2013/0126773 A1 * | 5/2013 | Ajdelsztajn | ............... | C23C 4/129 |
| | | | | 427/455 |
| 2013/0236738 A1 * | 9/2013 | Yamauchi | ............... | C23C 28/34 |
| | | | | 427/294 |
| 2013/0263771 A1 * | 10/2013 | Kobayashi | ............... | C30B 29/406 |
| | | | | 117/9 |
| 2014/0083995 A1 * | 3/2014 | Takahara | ............... | H05B 3/688 |
| | | | | 427/180 |
| 2014/0134448 A1 * | 5/2014 | Yamauchi | ............... | B05D 1/12 |
| | | | | 427/314 |
| 2014/0234551 A1 * | 8/2014 | Sparkes | ............... | B23K 26/342 |
| | | | | 118/641 |
| 2015/0068560 A1 | 3/2015 | Goluch et al. | | |
| 2015/0190824 A1 * | 7/2015 | Nardi | ............... | B05B 7/1404 |
| | | | | 239/311 |
| 2015/0251196 A1 * | 9/2015 | Hirano | ............... | C23C 24/04 |
| | | | | 118/308 |
| 2016/0047029 A1 * | 2/2016 | Fairbourn | ............... | B22F 5/04 |
| | | | | 427/256 |
| 2016/0136660 A1 * | 5/2016 | Song | ............... | C30B 29/403 |
| | | | | 118/300 |
| 2016/0153082 A1 * | 6/2016 | Kim | ............... | C23C 8/60 |
| | | | | 427/180 |
| 2017/0157671 A1 * | 6/2017 | King | ............... | B05B 13/041 |
| 2017/0157673 A1 * | 6/2017 | Slattery | ............... | B22F 3/003 |

FOREIGN PATENT DOCUMENTS

| | | |
|---|---|---|
| EP | 0 854 024 A2 | 7/1998 |
| JP | H 04-19070 A | 1/1992 |
| JP | H8-298252 A | 11/1996 |
| JP | H 9-299889 A | 11/1997 |
| JP | H10-223587 A | 8/1998 |
| JP | H 11-297653 A | 10/1999 |
| JP | 2006-253629 A | 9/2006 |
| JP | 4120991 B2 | 7/2008 |
| JP | 2009-191323 A | 8/2009 |
| JP | 2012-136757 A | 7/2012 |
| JP | 2014-76426 A | 5/2014 |
| JP | 2020-141128 A | 9/2020 |
| KR | 100328640 B1 | 3/2002 |
| KR | 2002-0076474 A | 10/2002 |
| KR | 100359339 B1 | 11/2002 |
| KR | 10-2009-0050707 A | 5/2009 |
| KR | 10-1038187 B1 | 6/2011 |
| KR | 10-1559112 B1 | 10/2015 |
| KR | 10-2017-0044396 A | 4/2017 |
| KR | 2018-0121829 A | 11/2018 |

(56) References Cited

FOREIGN PATENT DOCUMENTS

| TW | 201032266 A1 | 9/2010 |
|----|---|---|
| WO | WO-01/00336 A1 | 1/2001 |
| WO | WO-2005/089107 A2 | 9/2005 |
| WO | WO-2014046448 A1 | 3/2014 |
| WO | WO-2015/022732 A1 | 2/2015 |
| WO | WO-2017/098823 A1 | 6/2017 |
| WO | WO-2019/057310 A1 | 3/2019 |
| WO | WO-2020/110858 A1 | 6/2020 |

\* cited by examiner

US 11,866,819 B2

SURFACE TREATMENT APPARATUS AND SURFACE TREATMENT METHOD

CROSS-REFERENCE TO RELATED APPLICATIONS

A claim for priority under 35 U.S.C. § 119 is made to Korean Patent Application No. 10-2020-0143563 filed on Oct. 30, 2020, in the Korean Intellectual Property Office, the entire contents of which are hereby incorporated by reference.

BACKGROUND

Embodiments of the inventive concept described herein relate to a surface treatment apparatus and method for removing contaminants adhering to a surface of a part provided in an apparatus for treatment of a substrate, such as a wafer, and regenerating the surface of the part.

An atmospheric plasma spray (APS) coating film is a thermal spray coating film, and an APS coating technique is a coating process in which a ceramic material, such as Y2O3, is melted by a high-temperature plasma heat source and sprayed onto a surface of a base material.

The APS coating technique has a shortcoming in that a void layer and/or a crack layer exists inside a coating film and on a surface thereof due to rapid cooling of melted particles by contact with a base material. However, due to the advantage of rapidly stacking an Y2O3 film suitable for a plasma-resistant and corrosion-resistant environment in a semiconductor process, the APS coating technique has been widely used.

FIG. 1 is a photo illustrating a state after a part obtained by performing APS coating on an anodized aluminum alloy base material is used in a dry etching process for about 600 hours. When the part subjected to the APS coating is used in the dry etching process, a polymer layer is formed on the periphery of a coating film as a residue due to a process gas and by-products. In an initial stage of the process, the polymer layer is removed through in-suite dry cleaning (ISD). However, as the process time passes, the ratio of removal to adhesion is lowered, and a reaction film is expanded to a void layer and a crack layer inside the coating film.

Thereafter, when the outermost periphery of a coated surface transitions to a reaction saturation state, the etch rate is affected, and equipment PM work is performed accordingly. At this time, the inside of the coating film of the disassembled part is denatured so that an anodized insulating film in addition to the coating film may be damaged when an acid or alkali chemical is used. A cleaning method using a commonly used polishing head may affect a reduction in coating thickness and a change in surface average roughness by physically applying a force to a surface.

SUMMARY

Embodiments of the inventive concept provide a surface treatment apparatus and method for efficiently cleaning a part used in an apparatus for treatment of a substrate.

Embodiments of the inventive concept provide a surface treatment apparatus and method for reducing a reduction in coating thickness in a cleaning process of a part used in an apparatus for treatment of a substrate, compared to the related art.

Embodiments of the inventive concept provide a surface treatment apparatus and method for reducing time spent in regeneration of a part used in an apparatus for treatment of a substrate by cleaning the part and continuously coating the part.

Embodiments of the inventive concept provide an environmentally-friendly surface treatment apparatus and method not using a chemical treatment process such as acid or alkali chemical treatment.

The technical problems to be solved by the inventive concept are not limited to the aforementioned problems, and any other technical problems not mentioned herein will be clearly understood from the following description by those skilled in the art to which the inventive concept pertains.

According to an embodiment, a surface treatment apparatus includes a chamber having a treatment space therein, an exhaust line configured to evacuate the treatment space, a support provided in the treatment space and configured to support an object to be treated, a nozzle configured to spray particles or a gas to the object at supersonic speed, a moving member configured to move the nozzle or the object relative to each other, and a main supply line configured to supply first particles to the nozzle.

In an embodiment, the first particles may have a component the same as a coating component of the object or a component having hardness similar to that of the coating component of the object.

In an embodiment, the first particles may include one or more of Yttrium Oxide ($Y_2O_3$), Aluminum Oxide ($Al_2O_3$), Yttrium Aluminum Garnet (YAG), Yttria-Stabilized Zirconia (YSZ), and Zirconium Oxide ($Zr_2O_3$).

In an embodiment, the first particles may be granulated from raw material particles, or may be provided in a powder state.

In an embodiment, the first particles may have a size of several μm to 100 μm.

In an embodiment, the first particles may be supplied together with a carrier gas.

In an embodiment, the surface treatment apparatus may further include a gas supply line that supplies the gas to the nozzle.

In an embodiment, the gas supply line may be connected to the main supply line, and the first particles may be supplied to the main supply line through a particle supply line connected with the main supply line.

In an embodiment, the surface treatment apparatus may further include a controller, and the controller may perform control to spray the first particles through the nozzle at supersonic speed.

In an embodiment, the surface treatment apparatus may further include a controller, and the controller may perform control to spray the first particles through the nozzle at supersonic speed and move the object or the nozzle relative to each other, such that contaminants on a surface of the object are removed from the surface of the object by collision of the first particles with the contaminants, may stop the supply of the first particles, and may perform control to spray the gas through the nozzle to blow residues remaining on the surface of the object.

In an embodiment, the surface treatment apparatus may further include a controller, and the main supply line may additionally supply second particles the same as or different from the first particles to the nozzle. The controller may perform control to spray the first particles through the nozzle at supersonic speed and move the object or the nozzle relative to each other, such that contaminants on a surface of the object are removed from the surface of the object by collision of the first particles with the contaminants, may stop the supply of the first particles, may perform control to spray the gas through the nozzle to blow residues remaining on the surface of the object, and may perform control to spray the second particles through the nozzle to coat the surface of the object with the second particles.

In an embodiment, the object may be a part provided in an apparatus for treatment of a substrate such as a wafer and may be formed of an aluminum material coated with Yttrium Oxide ($Y_2O_3$).

According to an embodiment, provided is a method for treating a surface of an object to be treated, in which a part provided and contaminated in an apparatus for treatment of a substrate such as a wafer serves as the object to be treated. The method includes forming a vacuum in an atmosphere in which the object is provided and cleaning the surface of the object by collision of first particles with contaminants on the surface of the object at supersonic speed.

In an embodiment, the first particles may have a component the same as a coating component of the object or a component having hardness similar to that of the coating component of the object.

In an embodiment, the first particles may include one or more of Yttrium Oxide ($Y_2O_3$), Aluminum Oxide ($Al_2O_3$), Yttrium Aluminum Garnet (YAG), Yttria-Stabilized Zirconia (YSZ), and Zirconium Oxide ($Zr_2O_3$).

In an embodiment, the first particles may be granulated from raw material particles, or may be provided in a powder state.

In an embodiment, the first particles may have a size of several μm to 100 μm.

In an embodiment, the first particles may be supplied together with a carrier gas.

In an embodiment, the method may further include stopping the supply of the first particles after the cleaning of the surface of the object, and removing residues remaining on the surface of the object by blowing a gas to the cleaned surface of the object.

In an embodiment, the method may further include coating the surface of the object with second particles the same as or different from the first particles by collision of the second particles with the surface of the object after the removing of the residues remaining on the surface of the object.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
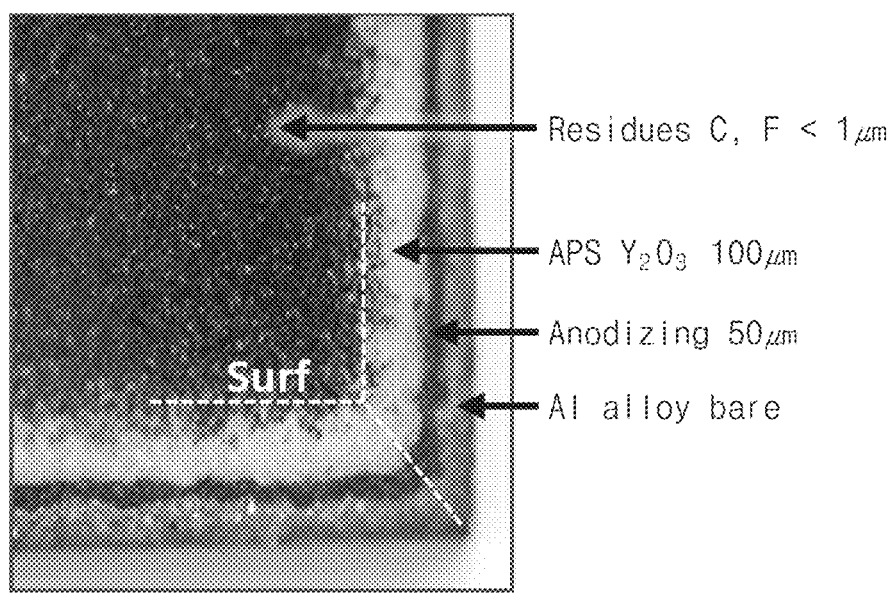
FIG. 1 is a photo illustrating a state after a part obtained by performing APS coating on an anodized aluminum alloy base material is used in a dry etching process for about 600 hours.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

Figure 2:
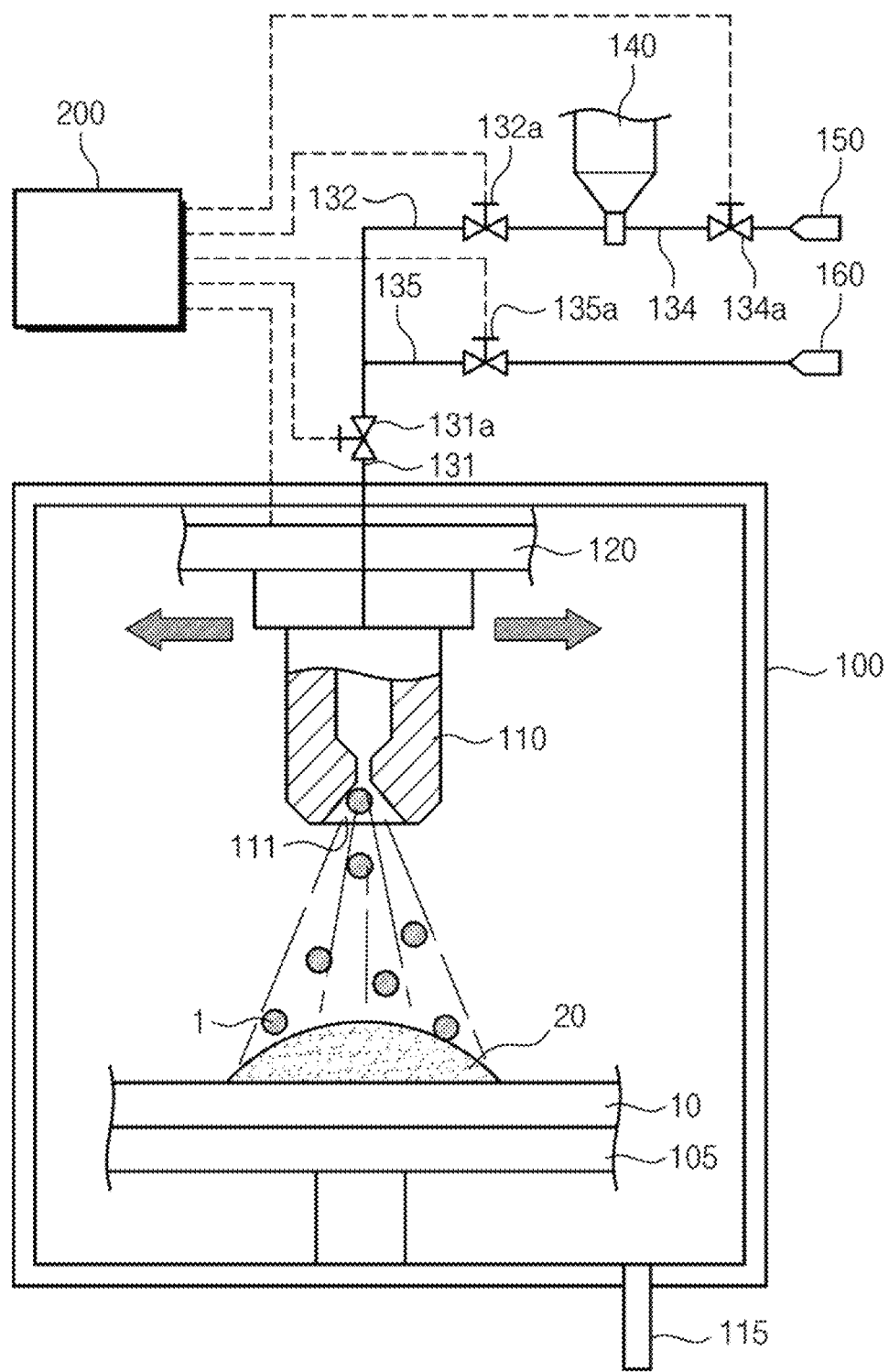
FIG. 2 illustrates a schematic view of a surface treatment apparatus according to an embodiment of the inventive concept and a sectional view of a nozzle included in the surface treatment apparatus.

FIG. 2 illustrates a schematic view of a surface treatment apparatus according to an embodiment of the inventive concept and a sectional view of a nozzle included in the surface treatment apparatus. The surface treatment apparatus according to the embodiment will be described with reference to FIG. 2. The surface treatment apparatus includes the nozzle 110, a moving member 120, and a controller 200. The surface treatment apparatus may include a support 105 that supports an object 10 to be cleaned. The surface treatment apparatus may include a chamber 100 that provides a treatment space. The treatment space of the chamber 100 may be under a vacuum atmosphere. For example, the treatment space of the chamber 100 may be connected with an exhaust line 115, and the atmosphere in the treatment space may be evacuated through a vacuum pump (not illustrated) that is connected to the exhaust line 115. Accordingly, a vacuum atmosphere may be formed in the treatment space. The object 10 to be cleaned may be placed in the vacuum atmosphere. The object 10 to be cleaned may be treated in the vacuum atmosphere.

The nozzle 110 is directly or indirectly coupled to the moving member 120 and is movable in the X-axis direction, the Y-axis direction, or the Z-axis direction. For example, the moving member 120 may be implemented with a moving stage movable in the X-axis direction, the Y-axis direction, or the Z-axis direction. Alternatively, the moving member 120 may be implemented with a robot arm.

Although the moving member 120 is illustrated as being directly or indirectly coupled with the nozzle 110, the moving member 120 may be configured to move the object 10 relative to the nozzle 10. For example, the moving member 120 may be configured to move the support 105, which supports the object 10 to be treated, in the X-axis direction, the Y-axis direction, or the Z-axis direction and may move the object 10 relative to nozzle 110.

The nozzle 110 is implemented with a supersonic nozzle and sprays cleaning particles 1, which will be described below, at supersonic speed. The supersonic nozzle may be referred to through various well-known documents. The nozzle 110 may be located to face toward a surface of the object 10 that is to be cleaned. Contaminants 20 may be deposited on the object 10 to form a film.

The nozzle 110 is connected with a main supply line 131. The main supply line 131 is connected with a particle supply line 132 and a gas supply line 135. The particle supply line 132 supplies the cleaning particles 1 to the nozzle 110. A cleaning-particle storage member 140 may be provided at an end of the particle supply line 132. The cleaning-particle storage member 140 may be provided in the form of a hopper. The particle supply line 132 may be connected to a lower end of the cleaning-particle storage member 140. The cleaning-particle storage member 140 may be connected with a carrier gas supply line 134. The carrier gas supply line 134 may supply a carrier gas to the cleaning-particle storage member 140. The carrier gas may carry the cleaning particles that are supplied to the nozzle 110. The carrier gas supply line 134 may be connected with a carrier gas supply 150. The carrier gas may be air or an inert gas. The gas supply line 135 supplies a gas to the nozzle 110. The gas supply line 135 may be connected with a gas supply 160. A main valve 131a may be disposed in line-with the main supply line 131. A first valve 132a may be disposed in line-with the particle supply line 132. A second valve 135a may be disposed in line-with the gas supply line 135. A third valve 134a may be disposed in line-with the carrier gas supply line 134. A heater 138 may be disposed in-line with the carrier gas supply line 134 and may heat, to a set temperature, the carrier gas that is supplied. The main valve 131a, the first valve 132a, the second valve 135a, and the third valve 134a may be simply implemented with opening/shutting valves, but may be implemented with flow control valves that can adjust flow rates.

Although not illustrated, flow meters may be disposed in-line with the main supply line 131, the particle supply line 132, the gas supply line 135, and the carrier gas supply line 134, respectively.

The controller 200 may control the main valve 131a, the first valve 132a, the second valve 135a, the third valve 134a, and the moving member 120.

The cleaning particles 1 are sprayed through the nozzle 110 at supersonic speed. The cleaning particles 1 may be provided as granules or powder. For example, Yttrium Oxide ($Y_2O_3$), Aluminum Oxide ($Al_2O_3$), Yttrium Aluminum Garnet (YAG), Yttria-Stabilized Zirconia (YSZ), and Zirconium Oxide ($Zr_2O_3$) may be selected as the cleaning particles 1. In addition to those listed, the cleaning particles 1 may be provided as particles having a hardness value similar to that of a coating film of the object 10 to be cleaned. In relation to the similar hardness value, $Al_2O_3$, YAG, YSZ, or $Zr_2O_3$ has a hardness value similar to that of the coating film of the object 10 when the coating film of the object 10 is $Y_2O_3$. One or more types of cleaning particles 1 may be selected and may be separately supplied. When one or more types of cleaning particles are separately supplied, additional supply lines connected to the main supply line 131 to supply the different cleaning particles may be further provided.

The cleaning particles 1 may be granulated. The surface treatment apparatus may include a component that granulates raw material particles. The diameter of the raw material particles may be several μm, and the diameter of the cleaning particles 1 obtained by granulating the raw material particles may be tens of μm. For example, the diameter (size) of the cleaning particles 1 may range from several μm to 100 μm. The diameter (size) of the cleaning particles 1 may preferably range from 20 μm to 50 μm. When the raw material particles are granulated and made larger in size, collision energy may be amplified. The size and shape of the cleaning particles 1 may be differently set depending on the hardness of the coating film and the contaminant film.

Figure 3:
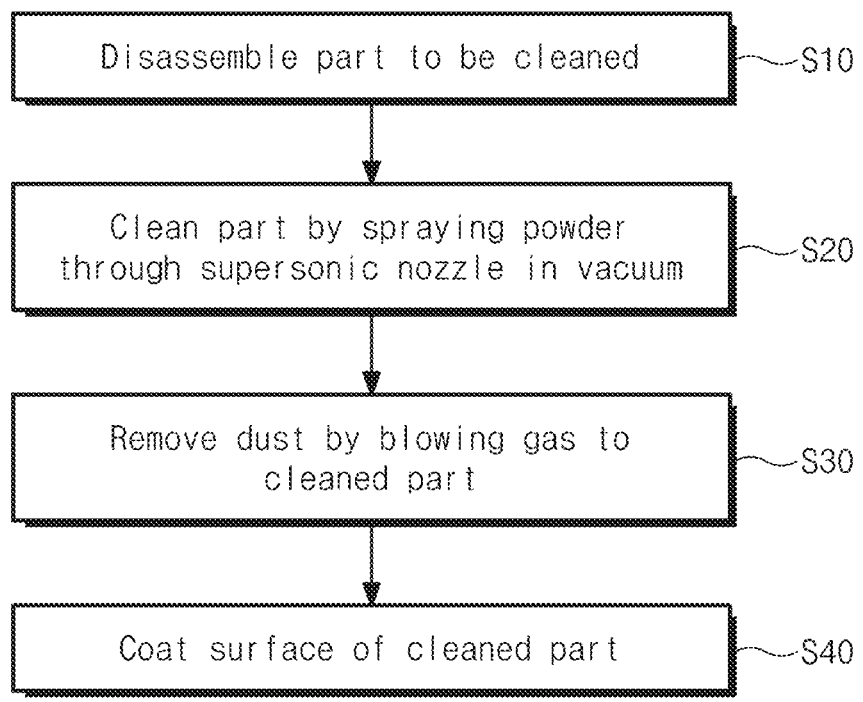
FIG. 3 is a flowchart illustrating a surface treatment method according to an embodiment of the inventive concept.

FIG. 3 is a flowchart illustrating a surface treatment method according to an embodiment of the inventive concept. The surface treatment method according to the embodiment will be described with reference to FIG. 3.

The surface treatment method according to the embodiment includes a step of disassembling a part to be cleaned (S10), a step of cleaning the part by spraying cleaning particles through the supersonic nozzle 110 in a vacuum (S20), a step of removing dust on a surface of the cleaned part by blowing a gas to the cleaned part (S30), and a step of recoating the surface of the cleaned part (S40).

Figure 4:
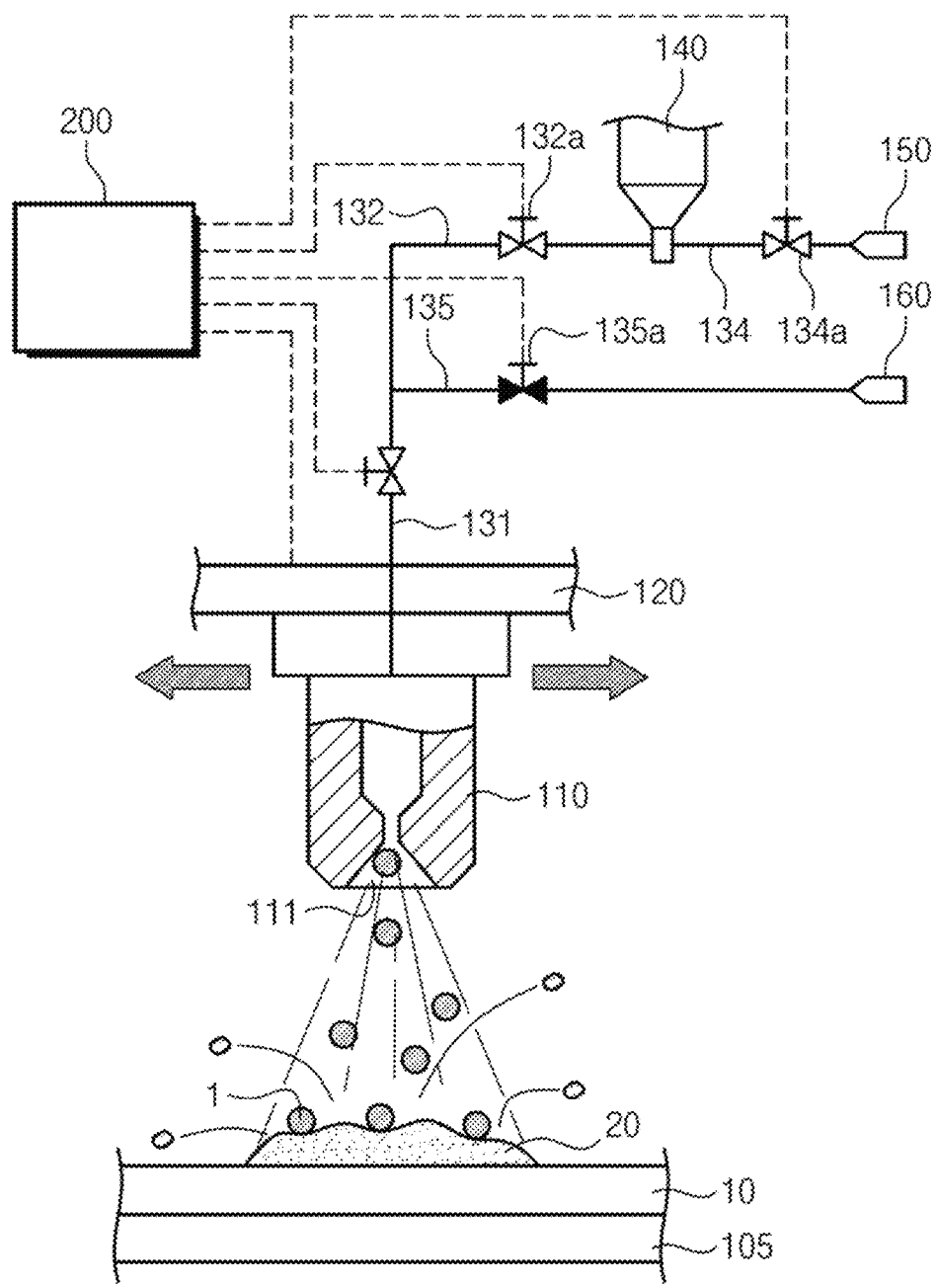
FIG. 4 is a view illustrating a step of cleaning a surface of a part using the surface treatment apparatus according to the embodiment of FIG. 2.
Figure 5:
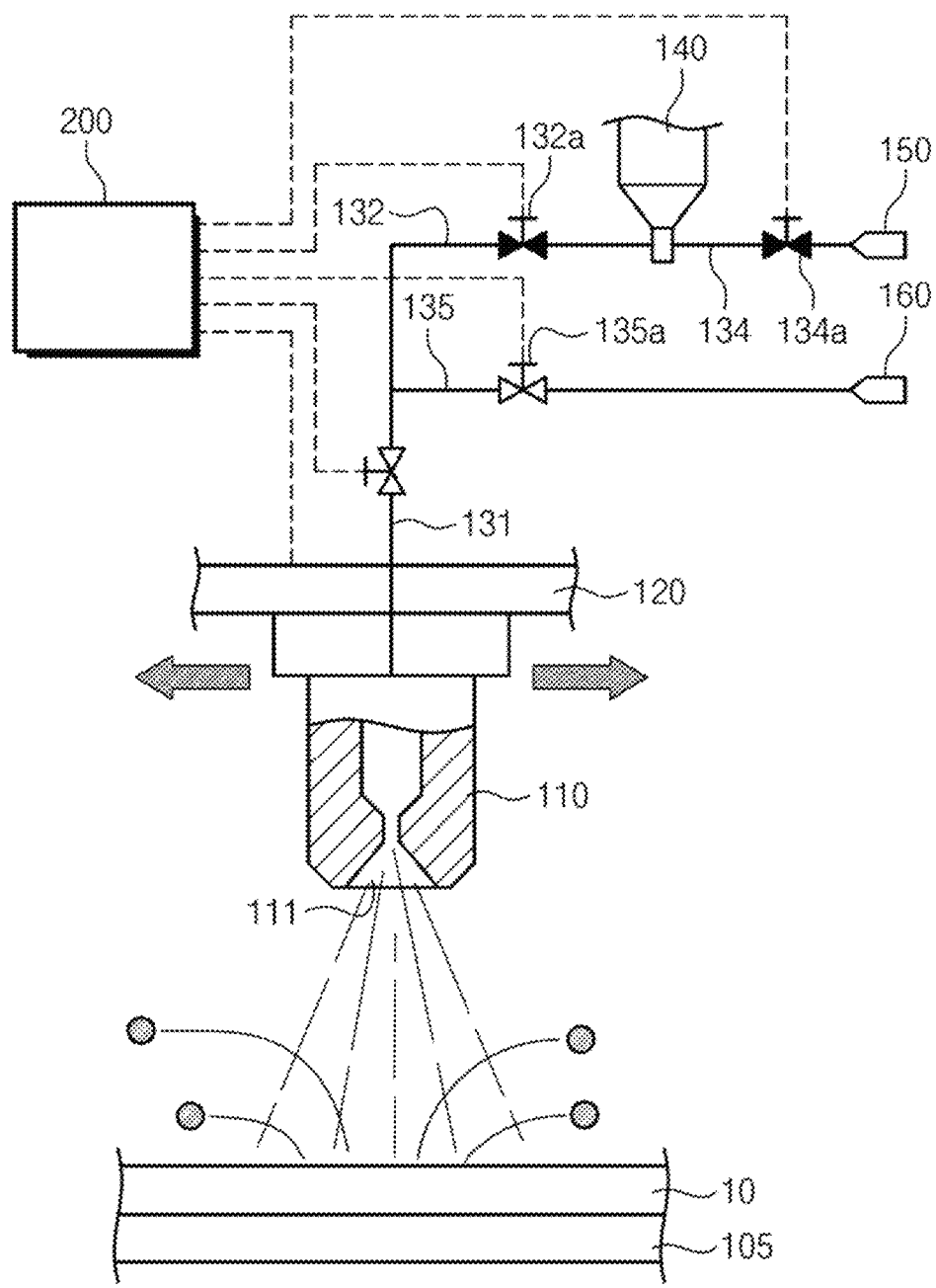
FIG. 5 is a view illustrating a step of blowing a gas to the surface of the part using the surface treatment apparatus according to the embodiment of FIG. 2.
Figure 6:
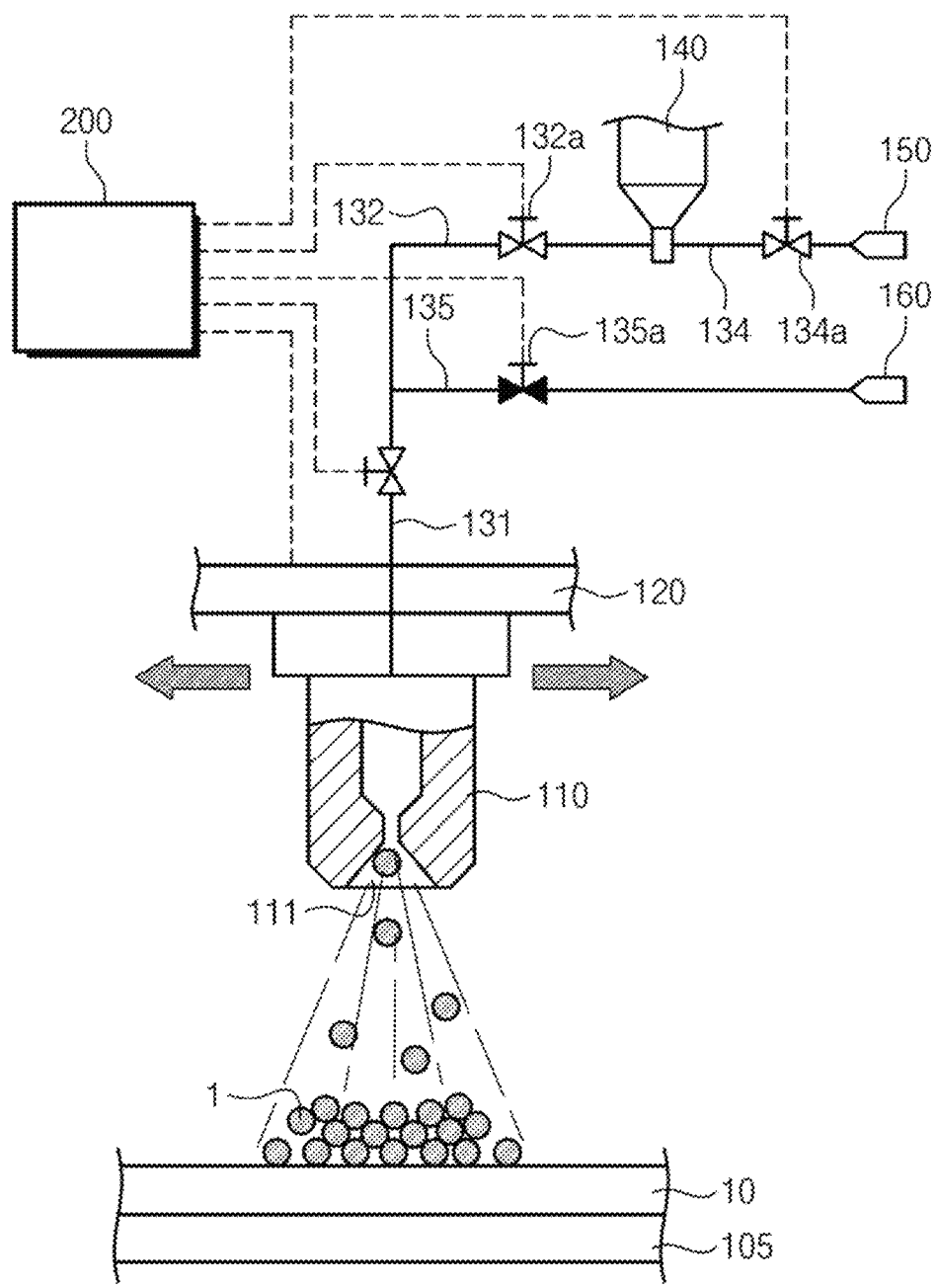
FIG. 6 is a view illustrating a step of coating the surface of the part using the surface treatment apparatus according to the embodiment of FIG. 2.

FIG. 4 is a view illustrating a step of cleaning a surface of a part using the surface treatment apparatus according to the embodiment of FIG. 2. FIG. 5 is a view illustrating a step of blowing a gas to the surface of the part using the surface treatment apparatus according to the embodiment of FIG. 2. FIG. 6 is a view illustrating a step of coating the surface of the part using the surface treatment apparatus according to the embodiment of FIG. 2. The surface treatment method using the surface treatment apparatus will be described with reference to FIGS. 4 to 6 in a serial order together with FIG. 3.

The object 10 to be cleaned is disassembled from a substrate treating apparatus and provided to the surface treatment apparatus. The object 10 to be cleaned may be a part obtained by performing APS coating on an anodized aluminum alloy base material using $Y_2O_3$. The object 10 to be cleaned may have the contaminants 20 deposited thereon according to the progress of a process. The contaminants 20 may be polymer-based contaminants.

Referring to FIG. 4, the main valve 131a, the first valve 132a, and the third valve 134a are opened, and the second valve 135a is closed. The cleaning particles 1 are sprayed onto the contaminated surface of the object 10 at supersonic speed. Collision energy of the cleaning particles 1 and the surface is able to be finely adjusted in a vacuum atmosphere. The cleaning particles 1 and the contaminants 20 collide with each other, and the contaminants 20 fall off the surface of the object 10.

When the temperature of the cleaning particles 1 or the temperature around the cleaning particles 1 is raised, the kinetic energy of the cleaning particles 1 may be increased. Accordingly, a cleaning force may be adjusted by controlling the temperature of the cleaning particles 1 or the temperature of the carrier gas supplied together with the cleaning particles 1.

Referring to FIG. 5, the main valve 131a and the second valve 135a are opened, and the first valve 132a and the third valve 134a are closed. Dust remaining on the cleaned surface of the object 10 is removed by blowing the gas to the cleaned surface of the object 10. The gas may be a gas of the same type as the carrier gas and may be an inert gas or air. According to an embodiment of the inventive concept, powder having hardness similar to that of the surface of the coating film rather than fine particles such as argon or carbon dioxide is used as the cleaning particles 1, and therefore the cleaning particles 1 are not sublimated after colliding with the contaminants 20. Residues of the cleaning particles 1 remaining on the surface of the object 10 without being sublimated and residues of the contaminants may be removed from the surface of the object 10 through a gas blow. The blown residues may be released through the exhaust line 115.

Referring to FIG. 6, the main valve 131a, the first valve 132a, and the third valve 134a are opened, and the second valve 135a is closed. The cleaning particles 1 are sprayed onto the cleaned surface of the object 10. In this step, the cleaning particles 1 function as coating particles.

The cleaning particles 1 are deposited onto the cleaned surface of the object 10 by controlling the atmosphere around the cleaning particles 1 or the temperature of the carrier gas, the pressure at which the nozzle 110 sprays the cleaning particles 1, and the particle size of the cleaning particles 1. Although it has been described in the embodiment of FIG. 6 that the cleaning particles 1 are provided as the coating particles, the coating particles may differ from the cleaning particles used in the cleaning process. As described above, when two or more types of particles are separately supplied through the nozzle 110, additional supply lines connected to the main supply line 131 to supply the different particles may be further provided.

Figure 7:
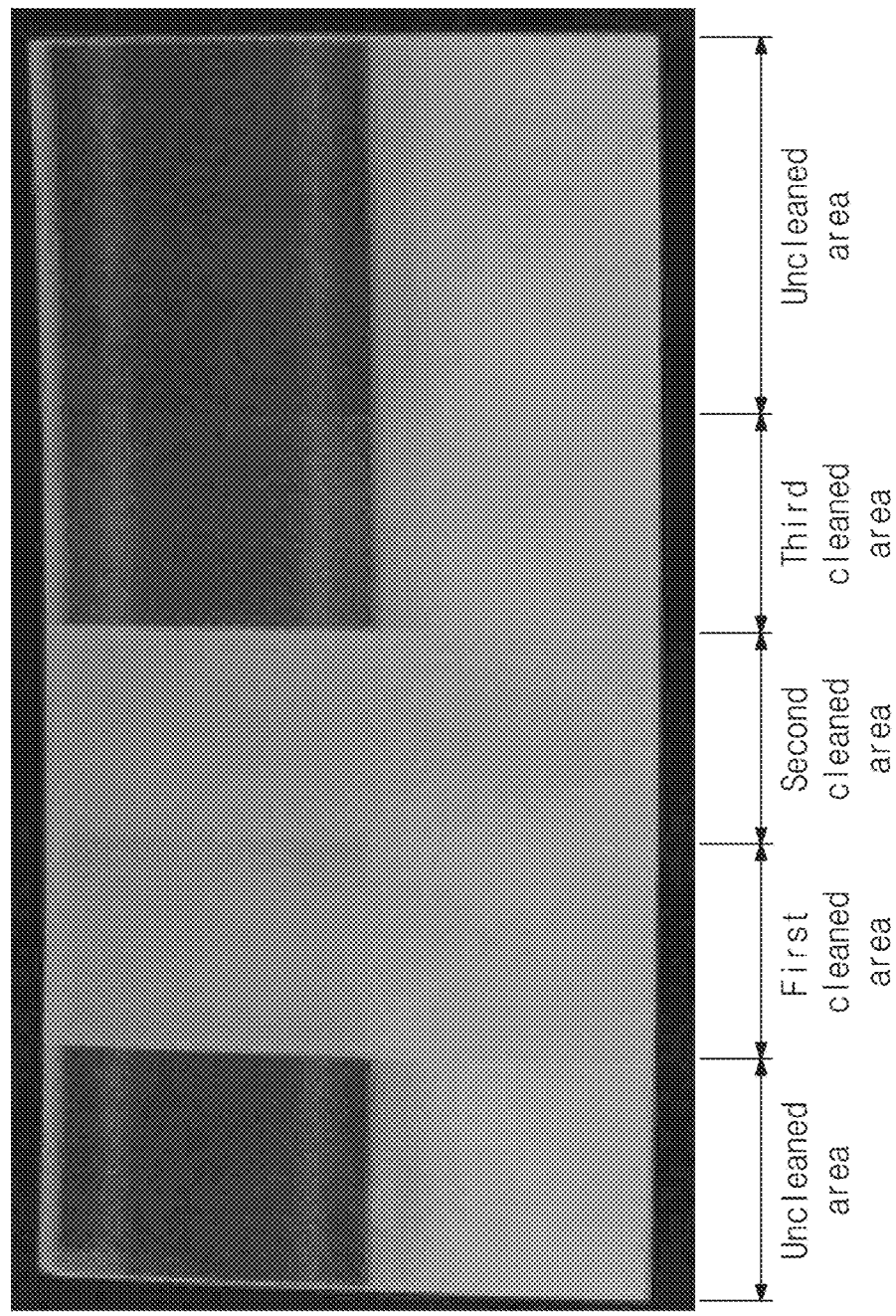
FIG. 7 is a photo illustrating cleaned surfaces of a part according to various embodiments of the inventive concept.

FIG. 7 is a photo illustrating cleaned surfaces of a part according to various embodiments of the inventive concept.

The first cleaned area, the second cleaned area, and the third cleaned area were cleaned under different conditions, respectively, and it was identified that cleaning forces existed in all the cases.

The first cleaned area was cleaned by spraying $Y_2O_3$ particles 50 times with clean dry air (CDA) as a carrier gas. The CDA was supplied at 30 standard liters per minute (slm). It is identified that the coating thickness of the first cleaned area is reduced by 10 µm.

The second cleaned area was cleaned by spraying $Y_2O_3$ particles 100 times with clean dry air (CDA) as a carrier gas. The CDA was supplied at 30 standard liters per minute (slm). It is identified that the coating thickness of the second cleaned area is reduced by 12 µm. Although the cleaning particles 1 were sprayed onto the second cleaned area 100 times, it is identified that the coating thickness is not significantly reduced and only contaminants are removed.

The third cleaned area was cleaned by spraying $Al_2O_3$ particles 50 times with clean dry air (CDA) as a carrier gas. The CDA was supplied at 30 standard liters per minute (slm). It is identified that the coating thickness of the third cleaned area is reduced by 4 µm.

The cleaned surfaces may be coated with $Y_2O_3$ particles with clean dry air (CDA) as a carrier gas after the cleaning. For example, coating particles may be provided as powder having particles of several µm or less, and a particle storage member in which the coating particles are stored and a particle storage member in which the cleaning particles are stored may be differently provided.

According to the embodiments of the inventive concept, the reduction in coating thickness is significantly small, compared to that in a conventional polishing cleaning method. For example, in the case of polishing, the coating thickness is reduced by 20 µm, whereas in the embodiments of the inventive concept, the coating thickness in the second cleaned area of FIG. 7 is reduced by 12 µm. Accordingly, the coating performance of the part may be maintained for a longer period of time. Furthermore, according to the embodiments of the inventive concept, by controlling the size of particles, the type of particles, and the spray speed, the particles supplied through the nozzle are applicable as cleaning particles and coating particles. Accordingly, deposition is able to be continuously performed after a surface of an object to be cleaned is cleaned, and thus productivity may be improved.

In addition, according to the embodiments of the inventive concept, the coating step is performed after the cleaning step. Accordingly, compensation for a lost thickness and the surface roughness of an original coating film may be maintained, and thus when a semiconductor process chamber is mounted, it is possible to minimize the occurrence of hunting by meeting the initial conditions.

As described above, according to the embodiments of the inventive concept, the surface treatment apparatus and method may efficiently clean a part.

According to the embodiments of the inventive concept, the surface treatment apparatus and method may reduce a reduction in coating thickness in a cleaning process of a part, compared to the related art.

According to the embodiments of the inventive concept, the surface treatment apparatus and method may reduce a surface average roughness change in a cleaning process of a part, compared to the related art.

According to the embodiments of the inventive concept, the surface treatment apparatus and method may reduce time spent in regeneration of a part by cleaning the part and continuously coating the part.

According to the embodiments of the inventive concept, the surface treatment apparatus and method may environmentally-friendly regenerate a part without using a chemical treatment process such as acid or alkali chemical treatment.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A surface treatment apparatus comprising:
    a chamber having a treatment space therein;
    an exhaust line configured to evacuate the treatment space;
    a support provided in the treatment space and configured to support an object to be treated;
    a nozzle configured to spray particles or a gas to the object at a supersonic speed;
    a moving stage configured to move the nozzle or the object relative to each other;
    a main supply line configured to supply first particles to the nozzle; and
    a controller configured to,
        control the nozzle to remove contaminants on a surface of the object based on a collision of the first particles with the contaminants by spraying the first particles at the supersonic speed on to the surface of the object and controlling the moving stage to move the object or the nozzle relative to each other, and
        subsequently control the nozzle to blow residues remaining on the surface of the object by stopping supply of the first particles and spraying the gas on to the surface of the object.

2. The surface treatment apparatus of claim 1, wherein the first particles have a component same as a coating component of the object or a component having hardness similar to that of the coating component of the object.

3. The surface treatment apparatus of claim 1, wherein the first particles include one or more of Yttrium Oxide ($Y_2O_3$), Aluminum Oxide ($Al_2O_3$), Yttrium Aluminum Garnet (YAG), Yttria-Stabilized Zirconia (YSZ), and Zirconium Oxide ($Zr_2O_3$).

4. The surface treatment apparatus of claim 2, wherein the first particles are granulated from raw material particles or provided in a powder state.

5. The surface treatment apparatus of claim 4, wherein the first particles have a size of several μm to 100 μm.

6. The surface treatment apparatus of claim 1, wherein the first particles are supplied together with a carrier gas.

7. The surface treatment apparatus of claim 1, further comprising:

a gas supply line configured to supply the gas to the nozzle.

8. The surface treatment apparatus of claim 7, wherein the gas supply line is connected to the main supply line, and
wherein the first particles are supplied to the main supply line through a particle supply line connected with the main supply line.

9. The surface treatment apparatus of claim 1, wherein the controller is further configured to, subsequent to controlling the nozzle to blow the residues, control the main supply line to supply second particles to the nozzle such that the surface of the object is coated with the second particles sprayed on to the surface of the object by the nozzle, the second particles being same or different from the first particles.

10. The surface treatment apparatus of claim 1, wherein the object is a part provided in an apparatus for treatment of a substrate and includes an aluminum material coated with Yttrium Oxide ($Y_2O_3$).

* * * * *